(12) United States Patent
Bostick et al.

(10) Patent No.: US 11,800,692 B2
(45) Date of Patent: Oct. 24, 2023

(54) SYSTEM AND METHOD FOR DATA CENTER COOLING WITH CARBON DIOXIDE

(71) Applicant: NOOTER/ERIKSEN, INC., Fenton, MO (US)

(72) Inventors: Glen L. Bostick, Columbia, IL (US); Piero Scapini, Milan (IT)

(73) Assignee: Nooter/Eriksen, Inc., Fenton, MO (US)

( * ) Notice: Subject to any disclaimer, the term of this patent is extended or adjusted under 35 U.S.C. 154(b) by 443 days.

(21) Appl. No.: 17/205,760

(22) Filed: Mar. 18, 2021

(65) Prior Publication Data

US 2021/0298198 A1   Sep. 23, 2021

Related U.S. Application Data

(60) Provisional application No. 62/991,931, filed on Mar. 19, 2020.

(51) Int. Cl.
| | |
|---|---|
| *H05K 7/20* | (2006.01) |
| *F25B 9/00* | (2006.01) |
| *F25B 40/00* | (2006.01) |
| *F25B 1/00* | (2006.01) |
| *F25B 41/33* | (2021.01) |
| *F25B 25/00* | (2006.01) |
| *F25B 41/20* | (2021.01) |
| *F25B 9/06* | (2006.01) |

(52) U.S. Cl.
CPC ............ *H05K 7/2079* (2013.01); *F25B 1/00* (2013.01); *F25B 9/008* (2013.01); *F25B 9/065* (2013.01); *F25B 25/005* (2013.01); *F25B 40/00* (2013.01); *F25B 41/20* (2021.01); *F25B 41/33* (2021.01)

(58) Field of Classification Search
CPC .. H05K 7/20745; H05K 7/20827; F25B 5/02; F25B 40/00; F25B 2309/061; F25B 2400/0417; F25B 2400/054
See application file for complete search history.

(56) References Cited

U.S. PATENT DOCUMENTS

| | | | | |
|---|---|---|---|---|
| 4,205,532 A * | 6/1980 | Brenan | ................... | F25B 30/02 62/115 |
| 5,352,272 A | 10/1994 | Moll et al. | | |
| 5,685,160 A * | 11/1997 | Abersfelder | ........ | F04B 27/1804 62/115 |
| 6,698,214 B2 * | 3/2004 | Chordia | .................. | F25B 9/008 62/502 |
| 6,701,725 B2 * | 3/2004 | Rossi | ...................... | F25B 49/02 702/182 |

(Continued)

*Primary Examiner* — Robert J Hoffberg
(74) *Attorney, Agent, or Firm* — Sandberg Phoenix & von Gontard P.C.

(57) ABSTRACT

A system for cooling a plurality of processors in a data center is disclosed. The cooling system includes a refrigeration system having a compressor for compressing a carbon dioxide (CO2) working fluid, an air cooled heat exchanger downstream from the compressor and located out-of-doors for cooling the working fluid, an expansion device downstream from the heat exchanger, a cooling device located within the data center in which the working fluid is expanded to cool the processors by circulating the cooled air around the processors, and a return line for the return of the working fluid from the cooling device to the compressor.

30 Claims, 4 Drawing Sheets

(56) References Cited

U.S. PATENT DOCUMENTS

| | | | |
|---|---|---|---|
| 7,216,498 B2* | 5/2007 | Manole | F25B 9/008 |
| | | | 62/126 |
| 7,621,137 B2* | 11/2009 | Aflekt | F25B 9/008 |
| | | | 62/126 |
| 8,019,477 B2* | 9/2011 | Bash | H05K 7/20836 |
| | | | 62/177 |
| 8,046,989 B2 | 11/2011 | Vandergriend et al. | |
| 8,062,617 B2 | 11/2011 | Stakhev et al. | |
| 8,166,752 B2 | 5/2012 | Garcia et al. | |
| 8,479,501 B2 | 7/2013 | McCarthy, Jr. | |
| 8,955,346 B2* | 2/2015 | Campbell | F25B 25/005 |
| | | | 62/276 |
| 9,301,432 B2* | 3/2016 | Nelson | F24F 11/0001 |
| 9,410,709 B2* | 8/2016 | Kopko | F24F 1/16 |
| 9,512,759 B2 | 12/2016 | Muthaiah et al. | |
| 9,915,200 B2 | 3/2018 | Minto et al. | |
| 10,107,495 B2 | 10/2018 | Minto | |
| 10,451,326 B2* | 10/2019 | Schreiber | F25B 49/022 |
| 11,262,096 B2* | 3/2022 | Terraz | F24F 11/30 |
| 11,499,765 B2* | 11/2022 | Werlen | F25B 9/008 |
| 2006/0059945 A1* | 3/2006 | Chordia | F25B 9/14 |
| | | | 62/114 |
| 2013/0098085 A1* | 4/2013 | Judge | F25B 41/00 |
| | | | 62/190 |
| 2014/0163744 A1* | 6/2014 | Dolcich | F24F 11/38 |
| | | | 700/276 |
| 2015/0376801 A1 | 12/2015 | Bairamijamal | |
| 2017/0350320 A1 | 12/2017 | Kippel et al. | |
| 2018/0238220 A1 | 8/2018 | Itou et al. | |
| 2019/0276757 A1 | 9/2019 | Liss et al. | |
| 2022/0389870 A1* | 12/2022 | Scapini | F02C 7/143 |

\* cited by examiner

SYSTEM AND METHOD FOR DATA CENTER COOLING WITH CARBON DIOXIDE

CROSS-REFERENCE TO RELATED APPLICATIONS

A claim of priority is made to U.S. Provisional Application No. 62/991,931, filed on Mar. 19, 2020, which is herein incorporated in its entirety.

STATEMENT REGARDING FEDERALLY SPONSORED RESEARCH OR DEVELOPMENT

Not Applicable.

BACKGROUND OF THE DISCLOSURE

As the need for additional and larger data centers grows with increasing use of internet activities and services, the need for improved efficiency in data center operations also grows. Data centers use power for two main activities, running computing equipment and cooling the computing equipment. It is therefore possible to increase data center efficiency by increasing the efficiency of the systems used in cooling the computing equipment.

Early data centers traditionally used standard heating, ventilation, and air conditioning (HVAC) systems similar to the type typically used in contemporary residential applications, the difference being in the capacity of the equipment. Over time, as processor power has increased, industrial chiller systems have become the industry standard.

In typical data centers such as the type shown in FIG. 1, a primary cooling loop and a secondary cooling loop are used to provide for cold air which is then used to cool the computing equipment. Given the high heat load of a data center, the typical cooling system includes a heat exchanger (or chiller) and a pump in order for the secondary cooling loop to remove heat from the primary cooling loop, the primary cooling loop being used to provide cold air to cool the computing equipment, such as processors or other heat sources. In particular, the term "processor" is meant to designate any device that produces heat in a data center and should be cooled.

Referring now to FIG. 1, a simplified schematic of a typical data center cooling system is shown. A primary cooling loop 10 provides for chilled water used to cool hot air coming from the computing equipment. The primary cooling loop 10 circulates water using a first pump 12. Chilled water is pumped by the first pump 12 to a first heat exchanger 14. At the first heat exchanger 14, hot air from the computing equipment passes over the first heat exchanger 14 and is cooled. Process return water exits the first heat exchanger 14 and then passes through a chiller 16 (i.e., second heat exchanger). The chiller 16 is a heat exchanger that cools the process return water by exchanging heat between the primary cooling loop 10 and a secondary cooling loop 18. The chiller 16 can be a heat exchanger or an adsorptive heat exchanger with an additional internal working fluid (e.g., bromine and/or water) and/or pump(s). The chilled water of the primary cooling loop 10 enters the first pump 12 after exiting the chiller 16.

The secondary cooling loop 18 provides a cooled working fluid such as water and/or glycol to the chiller 16 in order to cool the working fluid of the primary cooling loop 10. The working fluid of the secondary cooling loop 18 is driven by a second pump 20. The working fluid heated by the chiller 16 is pumped by the second pump 20 to a third heat exchanger 22. The third heat exchanger 22 is an air cooled exchanger being cooled with forced air exiting an evaporative cooler 24. The evaporative cooler 24 can be a cooling tower supplied by make-up water. The working fluid is cooled by the third heat exchanger 22 and then enters the chiller 16 to cool the working fluid in the primary cooling loop 10.

Other types of cooling systems employed for data center applications include liquid immersion cooling, free cooling, and adiabatic cooling. These systems all have some disadvantages. Immersion systems have high capital costs, free cooling (using cooler outside air temperatures) can only be used in some geographic locations, and adiabatic cooling requires moistened air which is not always compatible with computing equipment such that traditional cooling systems are also required.

SUMMARY OF THE PRESENT DISCLOSURE

The cooling system described in the present disclosure provides several advantages over the typical data center cooling system described with reference to FIG. 1. The typical system requires water loops, make up water, and evaporative towers (e.g., cooling towers), while the cooling system described herein does not require these components. By removing the need for water loops, make up water, and evaporative towers often associated with high heat removal systems, the cooling system of the present disclosure provides for reduced capital, operational, and maintenance costs. The cooling system of the present disclosure does not require such components, but such components can be used to further optimize performance where desired. By functioning without requiring water loops, make up water, and evaporative towers, the cooling system of the present disclosure provides greater flexibility. The cooling system of the present disclosure also eliminates a heat exchanger (the chiller 16) and a pump (second pump 20) of the typical cooling system while improving performance and functionality. Performance is improved because removal of heat exchangers improves the overall thermal cycle efficiency by reducing pressure losses within the flow loop. Removal of heat exchangers also improves efficiency by improving the overall heat transfer potential, for a given surface area, by removing the additional temperature differential associated with the heat exchanger.

These advantages of the cooling system of the present disclosure allow for a high heat load application such as data centers to employ a simple cooling system arrangement of the present disclosure that is similar to types used in low heat load applications such as residential heating and cooling (e.g., systems that do not require a cooling tower).

A system of the present disclosure is intended for cooling a plurality of processors within a data center in a building or enclosed space. Of course, ambient air is located outside of the building. The processors are typically arranged in a plurality of racks that are arranged in rows with aisles between the rows within the building or enclosed space. The cooling system is adapted to circulate cooled air around the processors for cooling the processors. More specifically, the system comprises a compressor for compressing a $CO_2$ working fluid. An air cooled heat exchanger is located downstream from the compressor and is located in the ambient atmosphere out-of-doors for cooling the working fluid. The system further has an expansion device downstream from the heat exchanger. A cooling device is located within the data center in which the working fluid is expanded for cooling air, either hot air discharged from the processors or outside ambient air, and for circulating such cooled air around the processors for cooling the processors. A return line is provided for returning the working fluid from the cooling device to the compressor.

A method of the present disclosure cools a plurality of processors within a data center that are located in a building or enclosed space with ambient air located outside of the building. The processors are arranged in a plurality of racks that are arranged in rows within the building or enclosed space with aisles between the rows. The method involves circulating cooled air around the processors for cooling the processors. More specifically, the method comprises compressing a CO2 working fluid in a compressor, cooling the CO2 working fluid in an air cooled heat exchanger downstream from the compressor located in the ambient atmosphere out-of-doors for cooling the CO2 working fluid. The method further comprises flowing or passing the CO2 working fluid through an expansion device downstream from the heat exchanger; expanding the CO2 working fluid in a cooling device located within the data center for cooling air and circulating such cooled air around the processors for cooling the processors. Lastly, the method involves returning the CO2 working fluid via a return line from the cooling device to the compressor.

Other objects and features of the cooling system of the present disclosure will be apparent in view of the disclosed hereinafter.

BRIEF DESCRIPTION OF THE DRAWINGS

Corresponding reference characters indicate corresponding parts throughout the several views of the drawings.

Figure 1:
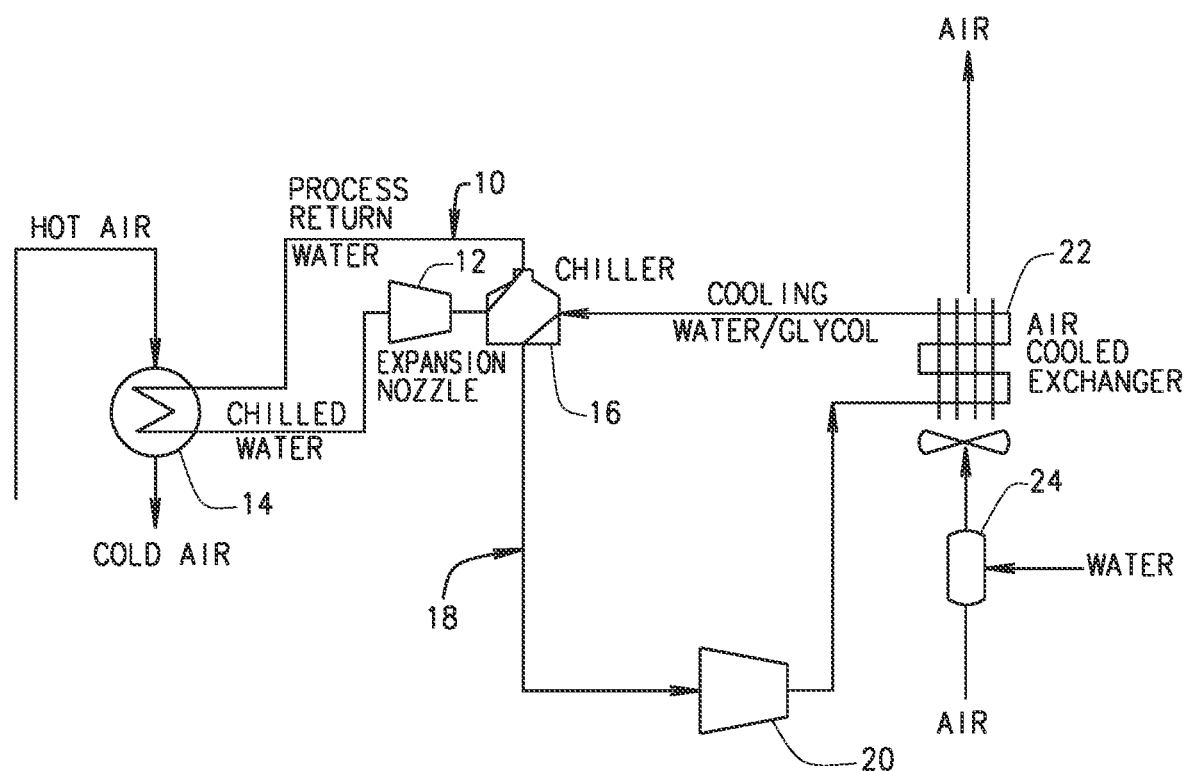
FIG. 1 is a simplified schematic view of a prior art data center cooling system.

DETAILED DESCRIPTION OF PREFERRED EMBODIMENTS OF THE SYSTEM AND METHOD OF THE PRESENT DISCLOSURE

The following detailed description illustrates the claimed cooling system and associated methods by way of example and not by way of limitation. The description enables one of ordinary skill in the relevant art to which this disclosure pertains to make and use the disclosure. This detailed description describes several embodiments, adaptations, variations, alternatives, and uses of the disclosure, including what is presently believed to be the best mode of implementing the claimed cooling system and associated methods. Additionally, it is to be understood that the disclosure is not limited in its application to the details of construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

Figure 2:
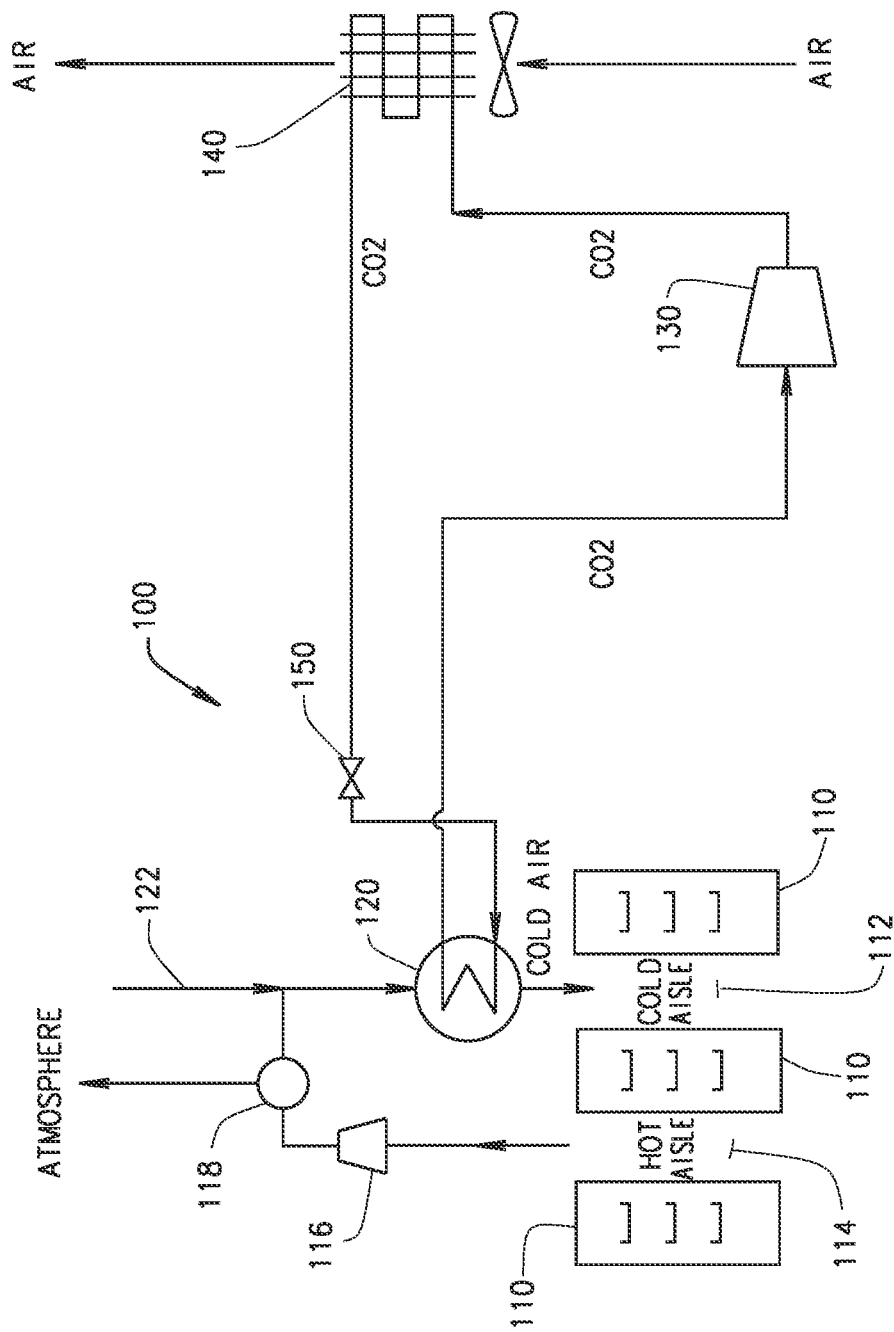
FIG. 2 is a simplified schematic view of a cooling system for a data center according to one embodiment of the present disclosure.

Referring now to FIG. 2, an embodiment of a cooling system 100 for a data center is shown. The computing equipment can be located in a building or other enclosed space, such as a computer equipment room or processing room within a building. Of course, the building is surrounded with ambient outside air. The computer equipment includes a plurality of processors or other heat sources arranged in rows of racks 110 with cold aisles 112 and hot aisles 114 between the rows 110 such that there are alternating cold aisles 112 and hot aisles 114 between rows of racks 110 for air flow through the aisles between the racks. The cooling system 100 is adapted to supply cold air to and through the cold aisles 112 to flow from the cold aisles and through the rows 110 of racks and to cool the processors or other heat sources in rows 110 of racks. Air heated by the processors in the row 110 of racks exits and is forced or drawn into the adjacent hot aisle 114 by an exhaust fan 116. This hot air can then be selectively either exhausted to the atmosphere or returned to chiller 120 to be re-cooled and then returned to the cold aisles 112. A diverting damper 118 is provided that can be selectively used to discharge the heated air to the atmosphere outside the building, in which case ambient air from outside the building can be used to cool the processors. As mentioned, if outside air is to be used to cool the processors, it is preferable that it be properly conditioned so as to ensure that it is of the desired humidity level and is free of particulate material. Outside air can be supplied to chiller 120 by an intake duct 122 if the heated air from the hot aisles 114 is to be discharged to the atmosphere. The cooling system 100 includes a first heat exchanger 120, illustrated as a cooling device, over which hot air from the hot aisle(s) 114 or outside air is passed to provide cold air into and through the cold aisle(s). After passing through a row 110 of racks, the now heated air is discharged or is drawn into a hot aisle 114. If the hot air is to be re-cooled by the system of this disclosure, it is pulled from the hot aisles by exhaust fan 116 that collects all of the hot air from a group of hot aisles and returns the hot air to chiller 120 to be re-cooled and to be returned to the cold aisles for further cooling. If the outside air temperature is sufficiently cool and if the outside air is conditioned to remove excess humidity and solid particulates, the hot air from the hot aisles 114 can be discharged to the atmosphere via a discharge duct 118. Of course, the discharge of the hot air to the atmosphere can be controlled by damper 118. Those skilled in the art will recognize that if the outside ambient air is relatively cold, the air need not be cooled as much before it is discharged from the cooling coils to cool the processors and thus amounts to free cooling. Also, coils 120 can be positioned so as to discharge the cold air in cold aisles 112 such that the cooled air will flow into and through both of the adjacent rows 110 of racks to cool the processors therein. The air heated by the processors is discharged into the cold aisles 114, as above described.

The first heat exchanger 120 circulates a cooled working fluid in order to cool the hot air (or the outside ambient air). As opposed to typical data center cooling systems, the working fluid in cooling system 100 is carbon dioxide (CO2). The working fluid exiting the first heat exchanger 120 is heated relative to the working fluid entering the first heat exchanger 120 as a result of heat transfer from the hot air. The first heat exchanger 120 can be any suitable heat exchanger or can be an expansion cooling coil. It should be understood that the cooling system 100 can include a plurality of first heat exchangers 120. For example, and without limitation, a first heat exchanger 120 of the plurality can be positioned to cool each cold aisle of a plurality of cold aisle between rows of racks 110.

The heated working fluid exiting the first heat exchanger 120 enters a compressor 130. The compressor 130 can be a compressor or a pump configured as needed in a specific application depending on the phase of the carbon dioxide working fluid expected at the compressor 130. For example, the cooling system 100 can be configured to operate with subcritical carbon dioxide, in which case, the compressor 130 is a compressor configured to operate with a carbon dioxide gas input. In alternative embodiments, the cooling system 100 can be configured to operate with the carbon dioxide ($CO_2$) in a supercritical state, in which case, the working fluid can behave more similarly to a liquid and the compressor 130 is adapted to pump the working fluid. Further, in some embodiments, the carbon dioxide is maintained in a sub-cooled liquid state and the compressor 130 is a pump configured to receive and pump a liquid.

In the illustrated embodiment, the compressor 130 is preferably driven by a variable frequency drive motor (not shown). The variable frequency drive motor allows for the compressor 130 to be driven at different speeds in order to maintain process parameters for the working fluid. For example, and without limitation, the compressor 130 can be driven at varying speeds in order to maintain the working fluid in a certain state or to properly function given the state of the working fluid entering the compressor 130. In some embodiments, the compressor 130 and the variable frequency drive motor are adapted and configured to receive, at the inlet, the working fluid (e.g., carbon dioxide) in either a supercritical state or a sub-cooled liquid state. In alternative embodiments, the compressor 130 is driven by a fixed speed drive motor or a multi-speed but not variable frequency drive motor.

The compressor 130 drives the working fluid to an air cooled second heat exchanger 140. The second heat exchanger 140 cools the working fluid passing through the second heat exchanger by passing air over the second heat exchanger. The second heat exchanger 140 is preferably, but not necessarily, positioned out-of-doors and is thus separated from the rows of racks 110 which are positioned within a data center structure.

The cooled working fluid exiting the second heat exchanger 140 is then expanded by an expansion nozzle 150 positioned downstream of the second heat exchanger 140. The expansion nozzle 150 cools the working fluid by expanding the working fluid thereby reducing the pressure of the working fluid. The expanded and cooled working fluid then enters the first heat exchanger 120 to provide cooling to the computing equipment.

The motor driving the compressor 130 and the expansion nozzle 150 can be controlled in combination to maintain certain process conditions at the inlet of the compressor 130. For example, the motor driving the compressor 130 and the expansion nozzle 150 can be controlled to maintain the carbon dioxide working fluid in a supercritical state (or in alternative embodiments at a sub-cooled liquid state). This is in contrast to some systems which are operated in order to avoid liquid at the inlet of the compressor/pump. The cooling system 100 achieves increased efficiency relative to such systems by maintaining the carbon dioxide at the inlet of the compressor 130 in either a supercritical or a sub-cooled liquid state. The pumping power required for pumping carbon dioxide in either a supercritical or a sub-cooled liquid state is significantly less than the pumping power required to compress carbon dioxide in a gas state. The cooling system 100 also controls the expansion nozzle 150 and/or the compressor 130 to balance the input state of the carbon dioxide such that the carbon dioxide exiting the compressor 130 is at a reasonably higher temperature than the sink temperature (i.e., the ambient outdoor temperature). In some embodiments, the expansion nozzle 150 is not controlled based on the operating pressure of the upstream second heat exchanger 140.

Control of the cooling system 100 differs from some cooling systems in that operation does not seek to achieve 100% phase change in the evaporator supplying cold air which induces a certain degree of superheat at a compressor inlet. Rather, and for example, the cooling system 100 can operate with the working fluid in a single state (e.g., a supercritical state). The cooling system 100 avoids 100% phase change in the first heat exchanger 120 to prevent overheating of computer processors, graphics processing units, or other computing equipment cooled by the cooling system 100. Such computing equipment is susceptible to damage from overheating. By operating without 100% phase change at the first heat exchanger 120 the working fluid maintains buffer heat capacity to prevent computing equipment overheating. By operating without 100% phase change at the first heat exchanger 120, the cooling system 100 also avoids flow distribution issues associated when there are a plurality of first heat exchangers 120. Were the working fluid to be completely in a gas phase, distribution to a plurality of first heat exchangers 120 would be complicated by the gaseous nature of the working fluid. The cooling system 100 avoids this issue with distribution by maintaining the working fluid in a supercritical state or a sub-cooled liquid state throughout (e.g., by controlling the expansion nozzle 150 and/or a variable frequency drive motor driving the compressor 130). Operating in a supercritical state provides for stable and simplified control process. In embodiments where the cooling system 100 operates with a transcritical cooling cycle, the level of evaporation at the first heat exchanger 120 is controlled to prevent a high level of evaporation to avoid potential overheating and/or distributions issues. For example, the cooling system 100 controls the expansion nozzle 150 and/or a variable frequency drive motor driving the compressor 130 to control the level of evaporation of the working fluid.

The cooling system 100 through its components and control provide several advantages over typical data center cooling systems. The cooling system 100 provides for data center cooling with less equipment than a typical cooling system. The cooling system 100 has only a single cooling loop including a compressor 130 and first and second heat exchangers 120, 140. In comparison, a typical cooling system of the type described with reference to FIG. 1 uses two compressors/pumps, three heat exchangers, and an evaporative cooler (e.g., a cooling tower). Thus, the cooling system 100 cools a data center with less equipment and less capital and maintenance costs. Additionally, the cooling system 100 uses carbon dioxide as the preferred refrigerant which is lower in cost than hydrofluorocarbon (HFC) refrigerants and is non-ozone depleting in contrast to HFC refrigerants. Further, in embodiments where the cooling system 100 maintains the carbon dioxide working fluid in a supercritical state, the energy required to operate the compressor 130 is reduced in comparison to other cooling systems which use carbon dioxide (e.g., in a transcritical cooling cycle).

The cooling system 100 of the present disclosure also provides an advantage relative to other cooling systems which can use carbon dioxide as a working fluid, in that the cooling system 100 operates with a single cooling loop. This is in contrast to other systems which can use or require a cascading system.

The cooling system 100 provides a further advantage in using carbon dioxide as the working fluid. The power demands of the compressor 130 are primarily a factor of the density/phase of the working fluid at the compressor inlet, the flow rate, and the pressure rise across the compressor 130. Carbon dioxide has very steep density gradients when the system is operated at or near the supercritical point. By operating the refrigeration cycle at supercritical conditions, the increased density of the carbon dioxide reduces power demand by the compressor in comparison to, for example, a two-phase vapor and liquid influent.

Additionally, the heat of compression for a liquid (or a supercritical fluid) is much less than that of a vapor of mixed liquid and vapor flow. The reduced heat of compression for a supercritical working fluid (e.g., supercritical carbon dioxide) compared to other phases is an important aspect of a carbon dioxide working fluid because there is a need to cool off the compressor effluent with ambient air prior to returning the working fluid back to the data center for heat removal. Because the heat of compression of supercritical carbon dioxide is reduced relative to other states, less cooling with ambient air is required and power cost is reduced. Also, because the heat of compression is reduced, less expansion is needed to cool the working fluid prior to returning it to the data center for heat removal. By reducing the amount of expansion performed by the expansion nozzle or other expansion, the pressure rise across the compressor is reduced and thereby the power cost is reduced as well.

Figure 3:
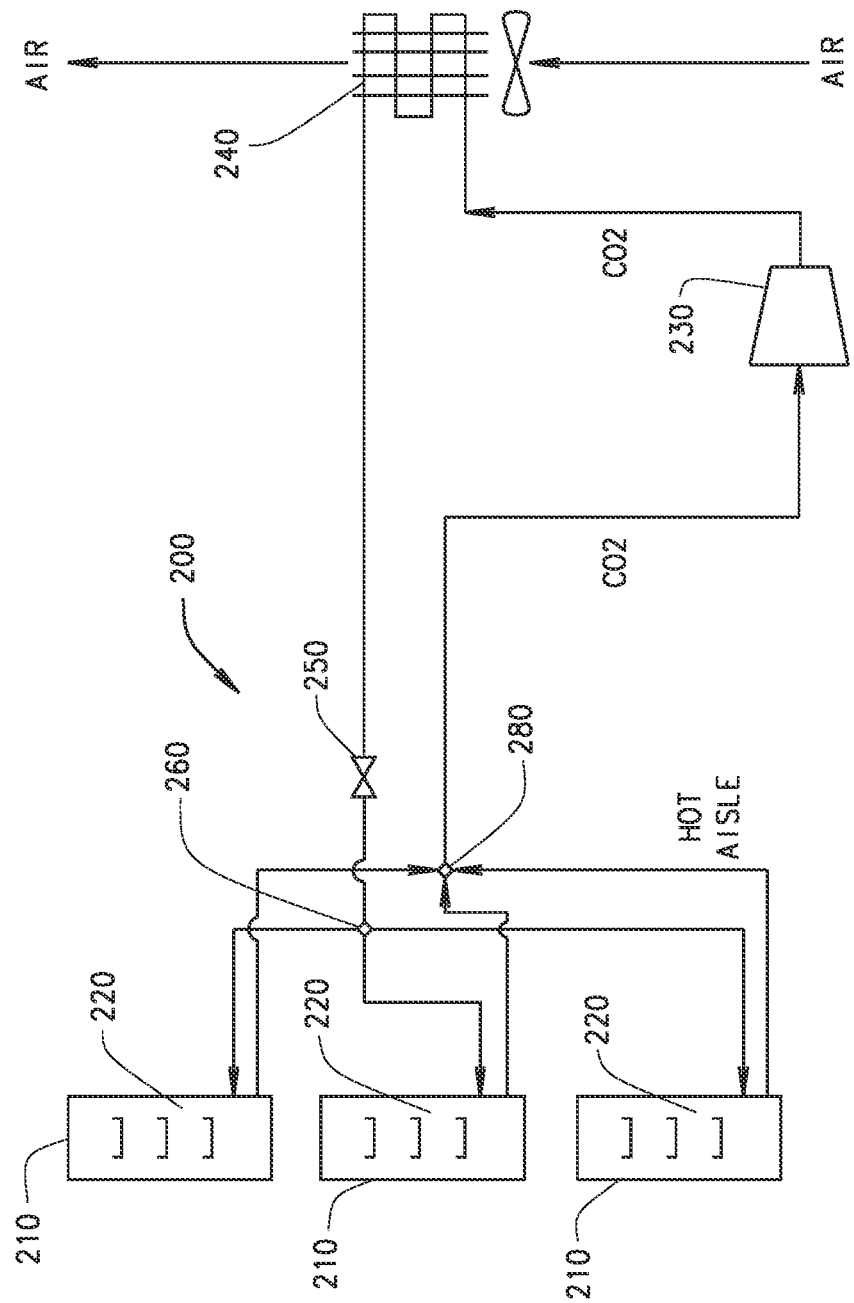
FIG. 3 is a simplified schematic view of a cooling system for a data center according to a second embodiment of the present disclosure, the cooling system including in rack coolers.

Referring now to FIG. 3, a simplified schematic of a second embodiment 200 of a cooling system is illustrated. The cooling system 200 is substantially similar to the cooling system 100 described with reference to FIG. 2. Similarly numbered and illustrated components are the same or substantially similar components. For example, second heat exchanger 240 is the same as second heat exchanger 140 and expansion nozzle 250 is the same as expansion nozzle 150. The second embodiment of the cooling system 200 differs from the cooling system 100 described with reference to FIG. 2 in that in this embodiment cooling system 200 uses in-rack coolers rather than row cooling. Each rack 210 includes its own each exchanger 220 (e.g., a cooling coil). The in rack coolers pass air over the heat exchanger 220 to cool computing equipment within each rack 210. The cooling system 200 includes distribution equipment to direct cooled carbon dioxide to each of the plurality of heat exchangers 220. For example, the cooling system 200 includes a distribution manifold 260 to distribute the working fluid from the expansion nozzle 250 to each of the plurality of heat exchangers 220. The distribution manifold 260 is adapted and configured to supply working fluid to each heat exchanger 220 as equally as possible. As previously explained with reference to FIG. 2, the cooling system 200 can operate with the carbon dioxide maintained in either a supercritical or sub-cooled state to aid in distribution of the carbon dioxide to each of the plurality of heat exchangers 220.

The cooling system 200 further includes a collection manifold 280. The collection manifold 280 is adapted and configured to receive heated working fluid from each of the heat exchangers 220 and then pass a combined flow to the compressor 230. The collection manifold 280 includes any suitable equipment including, for example and without limitation, a plurality of check valves to prevent back flow of the heated working fluid.

Figure 4:
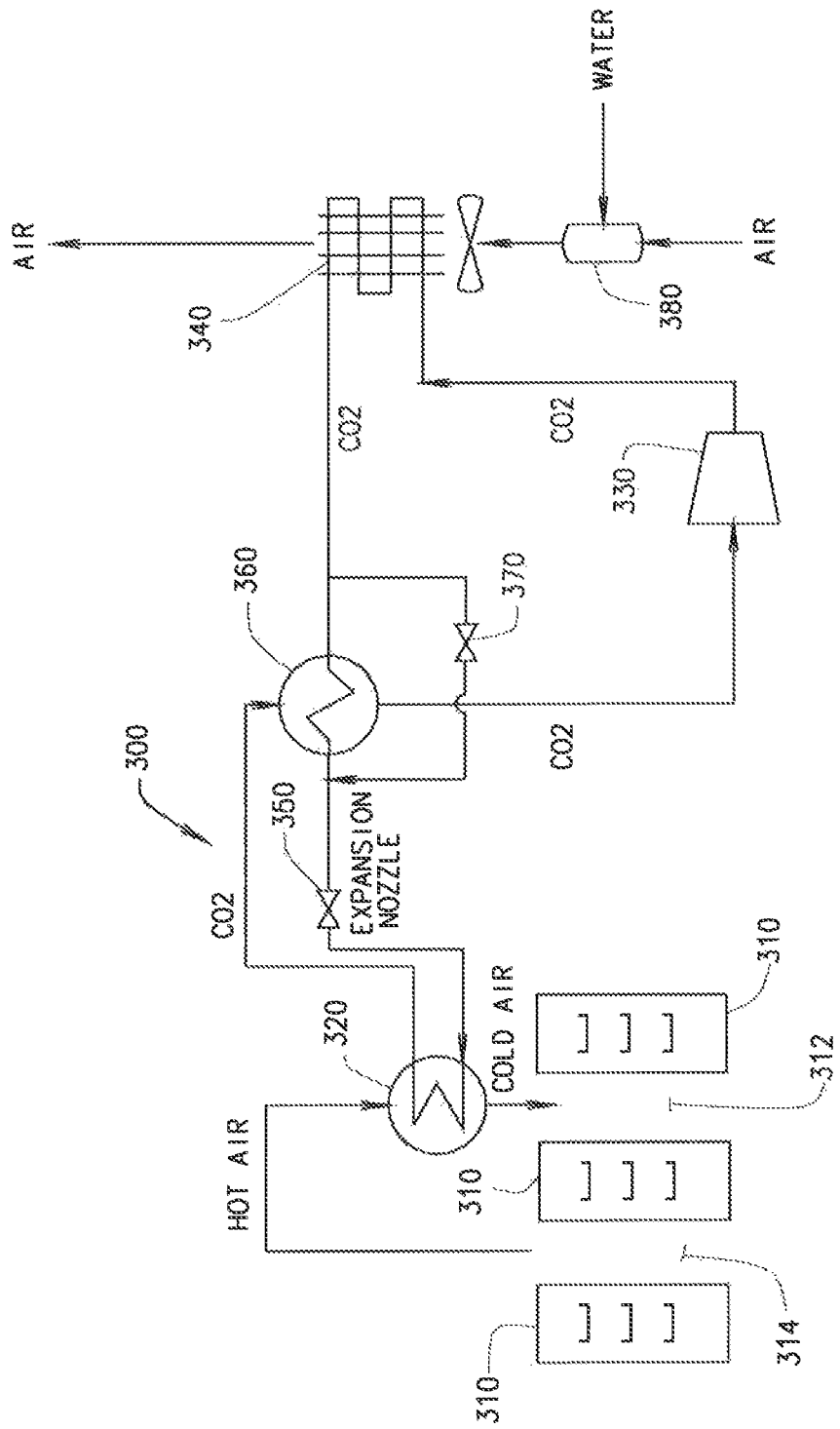
FIG. 4 is a simplified schematic view of a cooling system for a data center according to a third embodiment of the present disclosure, the cooling system including a recuperator and optionally including an evaporative cooler.

Referring now to FIG. 4, a simplified schematic of a third embodiment 300 of a cooling system is illustrated. The cooling system 300 is substantially similar to the cooling system 100 described with reference to FIG. 2. Similarly numbered and illustrated components are the same or substantially similar components. For example, expansion nozzle 350 is the same as expansion nozzle 150. As shown in FIG. 4, cold air from chiller 320 is discharged into a cold aisle 312 so as to flow over or around the processors or other heat sources in the adjacent rows 310 of racks, and then this now heated air is discharged into a hot aisles 314 as previously described in regard to FIG. 2. Cooling system 300 differs from cooling system 100, described with reference to FIG. 2, primarily in that cooling system 300 includes a recuperator 360. The recuperator 360 is positioned between the heat exchanger 320 and the compressor 330 such that the recuperator 360 receives heated working fluid from the heat exchanger 320. The recuperator 360 exchanges heat between the working fluid prior to the expansion nozzle 350 and the working fluid after the heat exchanger 320. This exchange allows for further control of the parameters (e.g., temperature and/or pressure) of the working fluid entering the inlet of the compressor 330. This can be used, for example, to maintain the working fluid (e.g., carbon dioxide) in a supercritical or sub-cooled state at the inlet of the compressor 330. This reduces the pumping power required as previously described.

The cooling system 300 further includes a controllable bypass 370 adapted and configured to selectively bypass the recuperator 360. The bypass 370 allows for the working fluid exiting the second heat exchanger 340 to bypass the recuperator 360, in full or in part, and to proceed directly to the expansion nozzle 350. By selectively controlling a valve of the bypass 370, the parameters of the working fluid at the inlet to the expansion valve 350 and at the inlet of the compressor 330 can be controlled. Control of the parameters of the working fluid at the inlet of the compressor 330 can be used to optimize power usage by the compressor 330.

The cooling system 300 also optionally includes an evaporative cooler 380. The evaporative cooler 380 is adapted and configured to cool air using the evaporation of water and supply the cooled air to the second heat exchanger 340. The evaporative cooler 380 can be any suitable evaporative cooler. In alternative embodiments, the cooling system 300 does not include an evaporative cooler 380.

Referring generally to FIGS. 2-4, the cooling system 100, 200, 300 according to the embodiments described are controlled according to one or more control schemes. The cooling system is operated by control of the expansion valve, variable frequency drive motor powering the compressor, and/or a recuperator and associated bypass to achieve certain process parameters. In one embodiment, the cooling system is controlled such that: the working fluid upstream of the expansion valve has a temperature and pressure consistent with supercritical conditions of the working fluid (e.g., with pressure and temperature above the critical point), downstream of the expansion valve the pressure of the working fluid is consistent with supercriticality but the temperature is below supercriticality, and at the inlet to the pump the working fluid is supercritical with both temperature and pressure above supercriticality (e.g., for carbon dioxide the temperature above 88° F., 31° C., the pressure above 1071 psi, 74 bar). In a second embodiment, the cooling system is controlled such that: the working fluid upstream of the expansion valve has a temperature and pressure consistent with supercritical conditions of the working fluid, downstream of the expansion valve the pressure of the working fluid is consistent with supercriticality but the temperature is below supercriticality, and at the inlet to the pump the working fluid has a pressure above supercriticality and a temperature below supercriticality. In a third embodiment, the cooling system is controlled such that: the working fluid upstream of the expansion valve has a temperature and pressure consistent with supercritical conditions of the working fluid, downstream of the expansion valve the pressure of the working fluid is below supercriticality and the temperature is below supercriticality, and at the inlet to the pump the working fluid has a pressure below supercriticality and a temperature below supercriticality. In a fourth embodiment, the cooling system is controlled such that: the working fluid, being carbon dioxide, upstream of the expansion valve is in a liquid state and has a temperature less than supercriticality and a pressure greater than supercriticality, downstream of the expansion valve the pressure of the working fluid is above supercriticality and the temperature is below supercriticality, and at the inlet to the pump the working fluid has a pressure above supercriticality and a temperature below supercriticality. In a fifth embodiment, the cooling system is controlled such that: the working fluid, being carbon dioxide, upstream of the expansion valve is in a liquid state and has a temperature less than supercriticality and a pressure greater than supercriticality, downstream of the expansion valve the pressure of the working fluid is below supercriticality and the temperature is below supercriticality, and at the inlet to the pump the working fluid has a pressure below supercriticality and a temperature below supercriticality. In a sixth embodiment, the cooling system is controlled such that: the working fluid, being carbon dioxide, upstream of the expansion valve is in a liquid state and has a temperature less than supercriticality and a pressure greater than supercriticality, downstream of the expansion valve the pressure of the working fluid is above supercriticality and the temperature is below supercriticality, and at the inlet to the pump the working fluid has a pressure below supercriticality and a temperature above supercriticality. In a seventh embodiment, the cooling system is controlled such that: the working fluid, being carbon dioxide, upstream of the expansion valve is in a liquid state and has a temperature less than supercriticality and a pressure greater than supercriticality, downstream of the expansion valve the pressure of the working fluid is above supercriticality and the temperature is below supercriticality, and at the inlet to the pump the working fluid has a pressure above supercriticality and a temperature above supercriticality. It should be understood that these seven embodiments are described merely for explanatory purposes and that other combinations of parameters are possible. The pressure upstream of the expansion valve will typically be higher than the supercritical point (e.g., 1071 psi, 74 bar), but such pressure is not strictly necessary. In all examples, the temperature downstream of the expansion valve is maintained below the supercritical point (e.g., 88° F., 31° C.). The temperature would only be higher in instances in which a very high temperature source is being cooled down to a value still higher than the critical point temperature.

Still referring generally to FIGS. 2-4, several embodiments of a cooling system are illustrated and described, but it should be understood that features of various described embodiments can be combined in further alternative embodiments. For example, in row cooling or in rack cooling can be used with any of the three embodiments specifically described with reference to FIGS. 2-4. In further alternative embodiments, the cooling system uses other types of computing equipment cooling utilizing the refrigeration loop described. For example, rather than in row cooling or in rack cooling, the cooling system can utilize direct cooling in which cooled working fluid from the expansion nozzle is directed directly to heat sinks associated with each central processing unit or graphics processing unit.

In a further alternative embodiment, a separate cooler is positioned upstream of the compressor and the cooling system does not have a recuperator. In this embodiment, there are essentially two distinct cooling units, one on the compressor inlet and one on the compressor outlet. In some variations, the cooling system does not include an expander but instead relies on the two cooling units to control the parameters of the working fluid throughout the cooling cycle. Such a system would have increased cost as a result of the additional cooling unit and associated electrical operating costs. Depending on the specific application, the costs can be outweighed by the savings provided by the reduction in pump power. To further offset the electrical costs of the two cooling units, the cooling system can provide for the ability to bypass the cooling unit fully or partially at the compressor inlet and/or the cooling unit at the compressor outlet. For example, on a cold day the cooling unit at the compressor outlet pump can be bypassed in order to reduce electrical costs associated with running the cooling unit at the compressor outlet pump. The reduced outdoor ambient temperature in such a case is sufficient for cooling the working fluid exiting the compressor. In another example, the cooling unit at the compressor inlet can be bypassed when there is a reduced heat load on the data center and/or there is cooler ambient temperature. By bypassing the cooling unit at the compressor inlet, the electrical cost of operating the cooling system can be reduced.

As described herein, the components of the cooling system can be controlled. Such control is provided by a control system of any suitable type (not shown in the Figures). The control system can rely on one or more temperature, pressure, flow rate, or other sensors of suitable type for use with the cooling system.

As various changes could be made in the above constructions methods without departing from the broad scope of the disclosure, it is intended that all matter contained in the above description or shown in the accompanying drawings shall be interpreted as illustrative and not in a limiting sense.

The invention claimed is:

1. A system for cooling a plurality of processors within a data center in a building or enclosed space with ambient air located outside of said building or enclosed space, said processors being arranged in a plurality of racks that are arranged in rows within the building or enclosed space, said system configured to circulate cooled air around said processors for cooling the processors, said system comprising:
   a compressor for compressing a CO2 working fluid;
   an air cooled heat exchanger downstream from said compressor, said air cooled heat exchanger located in an ambient atmosphere out-of-doors for cooling the CO2 working fluid, the ambient atmosphere out-of-doors having said ambient air;
   an expansion device downstream from said air cooled heat exchanger;
   a cooling device adapted to be located in proximity to said processors in which said CO2 working fluid can be expanded for cooling of air and for discharging said air as said cooled air around said processors for cooling said processors; and a return line for returning said CO2 working fluid from the cooling device to said compressor.

2. The system set forth in claim 1 wherein said cooling device is located within the building or enclosed space, said rows of said racks containing said processors, wherein the cooled air is adapted to be discharged into an aisle between adjacent ones of said rows of said racks containing said processors to cool said processors, and to discharge said air heated by the processors into another aisle on a side of said adjacent ones of the said rows.

3. The system as set forth in claim 2 wherein said cooling device is an expansion cooling coil configured to discharge said cooling air between said rows containing said processors so that the cooled air can be flow through said adjacent ones of said rows of said racks and so that said air heated by said processors in such said racks can be discharged into said another aisle such that said processors are cooled as the cooled air flows through a respective one of the rows, said return line being configured so that said CO2 working fluid after passing through said expansion device is either discharged to the atmosphere or returned to said compressor for being re-cooled.

4. The system as set forth in claim 1 wherein said cooling device is an expansion cooling coil configured so that said air cooled by said expansion cooling coil can cool the processors in a respective one of said rows of said racks.

5. The system as set forth in claim 1 wherein a state of said CO2 working fluid is capable of being actively controlled at a location of said compressor so as to optimize power usage by said compressor by changing a pressure of the CO2 working fluid so as to maintain the CO2 working fluid in either a supercritical state or a cooled liquid state.

6. The system as set forth in claim 5 in which a temperature of the CO2 working fluid exiting said compressor can be higher than a temperature of the outside ambient air.

7. The system as set forth in claim 5 wherein the state of said CO2 working fluid can be controlled at the location of said compressor to maintain the CO2 working fluid in either the supercritical state or the cooled liquid state.

8. The system as set forth in claim 5 wherein the state of said CO2 working fluid can be controlled by a combination of said compressor and said expansion device to maintain the CO2 working fluid in either the supercritical state or the cooled liquid state.

9. The system as set forth in claim 1 wherein said cooling system is configured such that said CO2 working fluid can be maintained in a supercritical state throughout an entirety of a cooling cycle.

10. The system as set forth in claim 1 wherein said cooling system is configured such that said CO2 working fluid can be maintained at either a supercritical state or a sub-cooled liquid state at an inlet of the compressor.

11. The system as set forth in claim 1 wherein, in said return line between said cooling device and said compressor, a recuperator is located for exchanging heat between said return line and a line connecting said cooling device to said air cooled heat exchanger for enabling control of the CO2 working fluid to be in a supercritical state or a cooled liquid state at an inlet of the compressor thereby to optimize power usage by the compressor.

12. The system as set forth in claim 1 further comprising a control system and at least one temperature sensor, and wherein said expansion device is configured to be controlled by the control system in response to a signal from the at least one temperature sensor to maintain a target temperature.

13. The system as set forth in claim 12 wherein said compressor includes a variable frequency drive motor, the variable frequency drive motor being configured to be controlled by the control system in response to a signal from the at least one temperature sensor to maintain the target temperature.

14. The system as set forth in claim 13 wherein the control system is configured to control the expansion device and the variable frequency drive motor based at least in part on the at least one temperature sensor to maintain the target temperature.

15. The system as set forth in claim 1 wherein said system further comprises a single cooling loop, said single cooling loop extending both inside and outside the building or enclosed space.

16. The system as set forth in claim 15 wherein said system includes only one of said single cooling loop.

17. The system as set forth in claim 16 wherein said system has said compressor as only a single pump.

18. The system as set forth in claim 16 wherein said single cooling loop has said compressor as only one pump.

19. The system as set forth in claim 1 wherein the cooling system comprises a plurality of said cooling device, each said cooling device being positioned to be proximate to a respective one of said rows of said racks.

20. The system as set forth in claim 1 wherein the cooling system comprises a plurality of said cooling device, each said cooling device being positioned immediately adjacent to a representative one of said processors or other heat source within a server rack enclosure.

21. The system as set forth in claim 1 wherein the system comprises a plurality of said cooling device, each said cooling device being positioned adjacent a heat sink associated with a representative one of said processors or other heat source within a server rack enclosure.

22. The system as set forth in claim 1 wherein the system is a non-cascading system.

23. A system for cooling a plurality of processors within a data center in a building or enclosed space with ambient air located outside of said building or enclosed space, said processors being arranged in a plurality of racks that are arranged in rows within the building or enclosed space, said system being configured to circulate cooled air around said processors for cooling the processors, said system comprising:

a compressor for compressing a CO2 working fluid;

an air cooled heat exchanger for cooling the CO2 working fluid, said air cooled heat exchanger located downstream from said compressor in an ambient outdoor atmosphere, the ambient atmosphere out-of-doors having said ambient air;

an expansion device downstream from said air cooled heat exchanger;

a cooling device located within the data center in which said CO2 working fluid can be expanded for cooling of air and for circulating said air as said cooled air around said processors for cooling said processors; and a return line for returning said CO2 working fluid from the cooling device to said compressor;

wherein a state of said CO2 working fluid is configured to be actively controlled at a location of said compressor so as to optimize power usage by said compressor by changing a pressure of the CO2 working fluid so as to maintain the CO2 working fluid in either a supercritical state or a liquid state; and wherein said system is configured to control a temperature of the CO2 working fluid exiting said compressor to be at a higher temperature than a temperature of the outside ambient air so that the CO2 working fluid can be cooled by said outside ambient air in said air cooled heat exchanger.

24. A system for cooling a plurality of processors within a data center in a building or enclosed space with ambient air located outside of said building or enclosed space, said processors being arranged in a plurality of racks that are arranged in rows within the building or enclosed space, said system being configured to circulate cooled air around said processors for cooling the processors, said system comprising:
- a compressor for compressing a CO2 working fluid;
- an air cooled heat exchanger downstream from said compressor, said air cooled heat exchanger located in an ambient atmosphere out-of-doors for cooling the CO2 working fluid, the ambient atmosphere out-of-doors having said ambient air;
- an expansion device downstream from said air cooled heat exchanger;
- a cooling device located within the data center in which said CO2 working fluid can be expanded for cooling of air and for circulating said air as said cooled air around said processors for cooling said processors; and
- a return line for returning said CO2 working fluid from the cooling device to said compressor;
- wherein a state of said CO2 working fluid is capable of being actively controlled at a location of said compressor so as to optimize power usage by said compressor by changing a pressure of the CO2 working fluid so as to maintain the CO2 in either a supercritical state or a cooled liquid state, and such that a temperature of the CO2 working fluid exiting said compressor can be higher than a temperature of the ambient air, and the state of said CO2 working fluid is configured to be controlled at the location of said compressor so as to maintain the CO2 working fluid in either the supercritical state or the cooled liquid state; and
- wherein the state of said CO2 working fluid is capable of being controlled by a combination of said compressor and said expansion device so as to maintain the CO2 working fluid in either the supercritical state or the cooled liquid state.

25. A method of cooling a plurality of processors within a data center in a building or enclosed space, ambient air being located outside of said building or enclosed space, said processors being arranged in a plurality of racks that are arranged in rows within the building or enclosed space, said method being configured to circulate cooled air around said processors for cooling the processors, said method comprising steps of:
a. compressing a CO2 working fluid in a compressor;
b. cooling said CO2 working fluid in an air cooled heat exchanger downstream from said compressor, said air cooled heat exchanger located in an ambient atmosphere out-of-doors, the ambient atmosphere out-of-doors having said ambient air;
c. flowing said CO2 working fluid through an expansion device downstream from said air cooled heat exchanger;
d. expanding said CO2 working fluid in a cooling device located within the data center to cool air, and circulating said air as said cooled air around said processors for cooling said processors; and
e. returning said CO2 working fluid via a return line from the cooling device to said compressor.

26. The method of claim 25 wherein there is an aisle between adjacent ones of said rows of said racks, said aisles being alternately referred to as a cold aisle or a hot aisle with a respective one of said rows of said racks therebetween, said cooling device being located proximate each of said cold aisle, and wherein the method further comprises discharging the cooled air from the cooling device such that the cooled air flows around said processors in a respective one of the rows thereby to cool the processors as the cooled air flows from a cold aisle having the cooling device on a first side of said respective one of the rows to a hot aisle on an opposing second side of said respective one of the rows.

27. The method of claim 25 wherein said processors in each of said rows are located within an enclosure, and wherein said cooling device is an expansion cooling coil located within said enclosure such that said cooled air discharged from said cooling device flows around said processors and is discharged from said enclosure.

28. The method of claim 25, wherein a recuperator is located in said return line between said cooling device and said compressor, and a line connects said air cooled heat exchanger to said cooling device, and
wherein the steps further comprise exchanging heat between said return line and the line connecting said air cooled heat exchanger to said cooling device.

29. A method for cooling a plurality of processors within a data center in a building or enclosed space, said processors being arranged in a plurality of racks that are arranged in rows within the building or enclosed space, said system method being adapted to circulate cooled air around said processors for cooling the processors, said method comprising steps of:
a. compressing a CO2 working fluid;
b. cooling said CO2 working fluid in an air cooled heat exchanger downstream from said compressor, said air cooled heat exchanger located in an ambient atmosphere out-of-doors, the ambient atmosphere out-of-doors having ambient air;
c. passing said CO2 working fluid in an expansion device downstream from said air cooled heat exchanger;
d. expanding said CO2 working fluid in a cooling device located in proximity to said processors and discharging said cooled air from said cooling device such that the cooled air is circulated around said processors for cooling said processors; and
e. returning said CO2 working fluid to said compressor via a return line;
f. wherein a state of said CO2 working fluid is configured to be actively controlled at a location of said compressor so as to optimize power usage by said compressor by changing the pressure of the CO2 working fluid so as to maintain the CO2 working fluid in either a supercritical state or a liquid state; and
g. wherein the temperature of the CO2 working fluid exiting said compressor can be higher than a temperature of the ambient air.

30. The method of claim 29, wherein a recuperator is located in said return line between said cooling device and said compressor, and a line connects said air cooled heat exchanger to said cooling device, and
wherein the steps further comprise exchanging heat between said return line and the line connecting said air cooled heat exchanger to said cooling device.

* * * * *